(12) United States Patent
Miwa

(10) Patent No.: US 6,429,136 B2
(45) Date of Patent: Aug. 6, 2002

(54) METHOD FOR FORMING A SHALLOW TRENCH ISOLATION STRUCTURE IN A SEMICONDUCTOR DEVICE

(75) Inventor: Kiyotaka Miwa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/766,206

(22) Filed: Jan. 19, 2001

(30) Foreign Application Priority Data

Jan. 21, 2000 (JP) ........................................ 2000-013430

(51) Int. Cl.[7] .............................................. H01L 21/00
(52) U.S. Cl. ........................... 438/692; 216/38; 216/88; 438/719; 438/723; 438/724; 438/745
(58) Field of Search ................................. 438/691, 692, 438/693, 719, 723, 724, 743, 744, 745, 756, 757; 216/38, 88, 89, 79, 91

(56) References Cited

U.S. PATENT DOCUMENTS

| | | | | |
|---|---|---|---|---|
| 5,858,858 A | * | 1/1999 | Park et al. | 438/692 X |
| 5,872,045 A | * | 2/1999 | Lou et al. | 438/692 X |
| 5,933,748 A | * | 8/1999 | Chou et al. | 436/692 X |
| 6,037,237 A | * | 3/2000 | Park et al. | 438/692 X |
| 6,190,999 B1 | * | 2/2001 | Hung et al. | 438/692 X |

FOREIGN PATENT DOCUMENTS

| | | |
|---|---|---|
| JP | 63-240042 | 10/1988 |
| JP | 10-50822 | 2/1998 |
| JP | 11-121607 | 4/1999 |
| JP | 11-340315 | 12/1999 |
| JP | 11-354628 | 12/1999 |
| JP | 2000-12674 | 1/2000 |

* cited by examiner

Primary Examiner—William A. Powell
(74) Attorney, Agent, or Firm—Hutchins, Wheeler & Dittmar

(57) ABSTRACT

In a method for forming a device isolation region of an STI structure in a semiconductor device, a surface protecting oxide film is formed on the surface of a trench by a thermal oxidation. Thereafter, a first silicon oxide film is deposited on the whole surface to fill up the trench and to cover the silicon nitride film on the principal surface of the silicon substrate, and then, by using the silicon nitride film as a stopper, a first CMP process is carried so that the first silicon oxide film remains in the trench. Thereafter, the silicon nitride film is removed, and a HTO film is formed on the pad oxide film covering the principal surface of the silicon substrate. Then, a second silicon oxide film is formed, and furthermore, a second CMP process is carried out to the extent that the principal surface of the silicon substrate is not exposed. Finally, a wet etching is carried so that the device isolation region of the STI structure is formed with no deterioration of the electric characteristics.

14 Claims, 7 Drawing Sheets

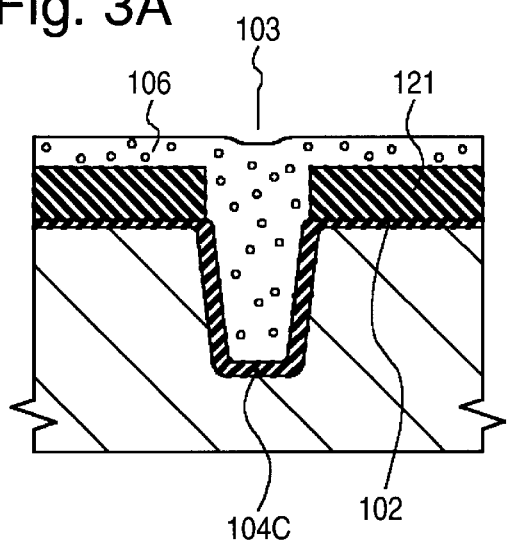
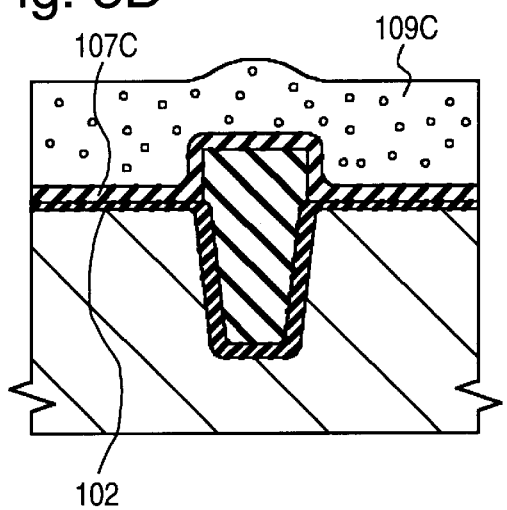
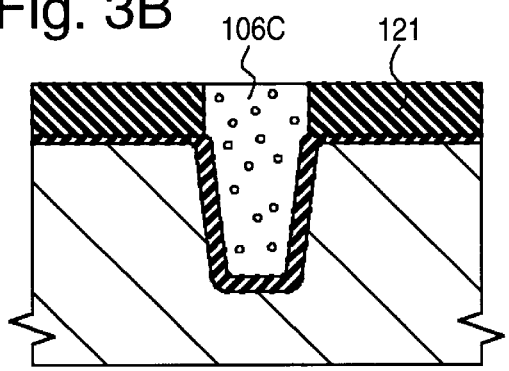
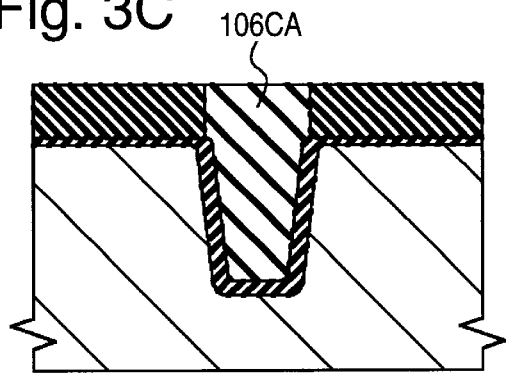

METHOD FOR FORMING A SHALLOW TRENCH ISOLATION STRUCTURE IN A SEMICONDUCTOR DEVICE

BACKGROUND OF THE INVENTION

The present invention relates to a method for fabricating a semiconductor device, and more specifically to a method for forming a device isolation region of an STI (shallow trench isolation) structure in a semiconductor device.

With a recent elevated integration density in semiconductor devices, it has become indispensable to reduce device isolation region size. Therefore, the industry has begun to adopt an STI structure in the device isolation region, in place of a LOCOS (local oxidation of silicon) structure. In the STI structure of the device isolation region, after a trench is formed, an insulating film is formed on the whole surface, and then, the insulating film is etched back so that the insulating film remains in only the trench. However, when the insulating film is etched back, a recess is formed in the neighborhood of the trench because a step difference is generated between the surface of a semiconductor substrate and the remaining insulating film filled in the trench. Because of this recess, a problem has been encountered in which an etching residue of a gate electrode forming material is generated along an upper edge of the trench, and an inverse narrow width effect occurs.

A, typical countermeasure for solving this problem is disclosed in Japanese Patent Application Pre-examination Publication No. JP-A-10-050882.

Now, the typical countermeasure will be described with reference to FIGS. 7A to 7D, which are diagrammatic sectional views illustrating the method disclosed in the above mentioned Japanese patent publication for forming the device isolation region of the STI structure in the semiconductor device.

On a principal surface of a silicon substrate 301, a pad oxide film 302 is formed by a thermal oxidation, and then, a silicon nitride film 321 is deposited on the whole surface by a CVD (chemical vapor deposition) process. A patterned photoresist film 322 is formed on a surface of the silicon nitride film 321. By using the patterned photoresist film 322 as a mask, the silicon nitride film 321, the pad oxide film 302 and the silicon substrate 301 are etched in the named order by an anisotropic etching process, so that a trench 303 is formed on the principal surface of the silicon substrate 301, as shown in FIG. 7A.

Thereafter, the patterned photoresist film 322 is removed, and then, a silicon oxide based insulating film is formed on the whole surface. Furthermore, a first CMP (chemical mechanical polish) process is carried out by using the silicon nitride film 321 as a stopper, so that there remains an, insulating film 305 filling up the trench 303, as shown in FIG. 7B.

Then, the silicon nitride film 321 is selectively removed as shown in FIG. 7C, leaving a portion of insulating film 305 remaining above the surface of the silicon substrate 301.

Succeedingly, a second CMP process is carried out using the silicon substrate 301 as a stopper, so that the pad oxide film 302 is removed and the insulting film 305 is partially removed, with the result that there remains an insulating film 305A filling up the trench 303, as shown in FIG. 7D. Thus, a device isolation region 313 of the STI structure is formed.

According to the device isolation region forming method disclosed in the above mentioned Japanese patent publication, an upper surface of the insulting film 305A and an upper surface of the silicon substrate 301 are substantially coplanar with each other at an upper end of the groove 303, so that the generation of the above mentioned recess is avoided. As a result, the previously mentioned problem of etching residue of the gate electrode forming material along the upper edge of the trench and the inverse narrow width effect can be prevented.

In the device isolation region forming method disclosed in the above mentioned Japanese patent publication, however, since the second CMP process is carried out using the silicon substrate 301 as the stopper, the principal surface of the silicon substrate in active regions is exposed to the CMP process. As a result, the active region is contaminated with metallic ions contained in a slurry used in the CMP process, so that another problem is encountered in which the metallic ions give an adverse influence to the electrical characteristics of semiconductor circuit components formed at the principal surface of the silicon substrate. Furthermore, since the principal surface of the silicon substrate in the active regions becomes rough, it is necessary to carry out an additional planarization step for repairing the surface roughness.

BRIEF SUMMARY OF THE INVENTION

Accordingly, it is an object of the present invention to provide a method for fabricating a semiconductor device, which has overcome the above mentioned problems of the prior art.

Another object of the present invention is to provide a method for forming a device isolation region of the STI structure in a semiconductor device, without deteriorating the electric characteristics and requiring no additional planarization step.

The above and other objects of the present invention are achieved in accordance with the present invention by a method for forming a device isolation region of a shallow trench isolation structure in a semiconductor device, the method including the steps of:

forming a pad oxide film and a silicon nitride film on a principal surface of a silicon substrate in the named order, and forming a trench which penetrates through the pad oxide film and a silicon nitride film and extends from the principal surface of the silicon substrate into a body of the silicon substrate;

carrying out a second thermal oxidation to form a surface protecting oxide film on a surface of the trench;

depositing a first silicon oxide film on the whole surface to fill up the trench and to cover the silicon nitride film, and carrying out a first chemical mechanical polishing for the first silicon oxide film until the silicon nitride film is exposed;

selectively removing the silicon nitride film, and forming a silicon oxide protection film including the pad oxide film and having an increased film thickness sufficient to protect the principal surface of the silicon substrate in a later step;

depositing a second silicon oxide film on the whole surface;

carrying out a second chemical mechanical polishing for planarization, to remove at least a major portion of the second silicon oxide film from the principal surface of the silicon substrate but to maintain the principal surface of the silicon substrate in an non-exposed condition; and carrying out a wet etching until the principal surface of the silicon substrate is exposed.

According to a first feature of the present invention, the silicon oxide protection film is formed by depositing a high-temperature oxide film on the whole surface including a surface of the pad oxide film.

According to a second feature of the present invention, the silicon oxide protection film is formed by carrying out a thermal oxidation to convert the pad oxide film into a thermal oxide film having an increased film thickness.

Specifically, according to the first feature of the present invention, there is provided a method for forming a device isolation region of a shallow trench isolation structure in a semiconductor device, the method including the steps of:

forming a pad oxide film on a principal surface of a silicon substrate by a first thermal oxidation, depositing a silicon nitride film on the whole surface, and carrying out an anisotropic etching using a patterned photoresist film formed on the silicon nitride film as a mask, to selectively remove the silicon nitride film and the pad oxide film and to form a trench in the principal surface of the silicon substrate;

carrying out a second thermal oxidation to form a surface protecting oxide film on a surface of the trench;

depositing a first silicon oxide film on the whole surface to fill the trench and to cover the silicon nitride film, and carrying out a first chemical mechanical polishing for the first silicon oxide film until the silicon nitride film is substantially exposed;

selectively removing the silicon nitride film, depositing a high-temperature oxide film on the whole surface, and then, depositing a second silicon oxide film on the whole surface;

carrying out a second chemical mechanical polishing for planarization, to remove at least a major portion of the second silicon oxide film from the principal surface of the silicon substrate but to maintain the principal surface of the silicon substrate in an non-exposed condition; and carrying out a wet etching until the principal surface of the silicon substrate is exposed.

Preferably, the high-temperature oxide film is formed by a low pressure chemical vapor deposition process.

In a preferred variation, the first silicon oxide film is formed by a high-density plasma-enhanced chemical vapor deposition process.

In another preferred variation, each of the first silicon oxide film and the second silicon oxide film is formed by a high-density plasma-enhanced chemical vapor deposition process.

In still another preferred variation, the first silicon oxide film is formed by a high-density plasma-enhanced chemical vapor deposition process, and the second silicon oxide film is formed by a sub-atmospheric chemical vapor deposition process using $\{O_3+TEOS\}$ as a starting material, or alternatively by depositing and baking a hydrogenated inorganic SOG film, and before the second chemical mechanical polishing, the second silicon oxide film is heat-treated in an oxygen atmosphere.

In a further preferred variation, the first silicon oxide film is formed by a sub-atmospheric chemical vapor deposition process using $\{O_3+TEOS\}$ as a starting material, or alternatively by depositing and baking a hydrogenated inorganic SOG film, and after the first chemical mechanical polishing but prior to the selective removal of the silicon nitride film, the first silicon oxide film is heat-treated in an oxygen atmosphere. In addition, the second silicon oxide film is formed by a sub-atmospheric chemical vapor deposition process using $\{O_3+TEOS\}$ as a starting material, or alternatively by depositing and baking a hydrogenated inorganic SOG film, and before the second chemical mechanical polishing, the second silicon oxide film is heat-treated in an oxygen atmosphere.

Specifically, according to the second feature of the present invention, there is provided a method for forming a device isolation region of a shallow trench isolation structure in a semiconductor device, the method including the steps of:

forming a pad oxide film on a principal surface of a silicon substrate by a first thermal oxidation, depositing a silicon nitride film on the whole surface, and carrying out an anisotropic etching using a patterned photoresist film formed on the silicon nitride film as a mask, to selectively remove the silicon nitride film and the pad oxide film and to form a trench in the principal surface of the silicon substrate;

carrying out a second thermal oxidation to form a surface protecting oxide film on a surface of the trench;

depositing a first silicon oxide film on the whole surface to fill up the trench and to cover the silicon nitride film, and carrying out a first chemical mechanical polishing for the first silicon oxide film until the silicon nitride film is exposed;

selectively removing the silicon nitride film, and carrying out a thermal oxidation to convert the pad oxide film into a thermal oxide film having an increased film thickness;

depositing a second silicon oxide film on the whole surface;

carrying out a second chemical mechanical polishing for planarization, to remove at least a major portion of the second silicon oxide film from the principal surface of the silicon substrate but to maintain the principal surface of the silicon substrate in an non-exposed condition; and carrying out a wet etching until the principal surface of the silicon substrate is substantially exposed.

In a preferred variation, the first silicon oxide film is formed by a high-density plasma-enhanced chemical vapor deposition process.

In another preferred variation, each of the first silicon oxide film and the second silicon oxide film is formed by a high-density plasma-enhanced chemical vapor deposition process.

In still another preferred variation, the first silicon oxide film is formed by a high-density plasma-enhanced chemical vapor deposition process, and wherein the second silicon oxide film is formed by a sub-atmospheric chemical vapor deposition process using $\{O_3+TEOS\}$ as a starting material, or alternatively by depositing and baking a hydrogenated inorganic SOG film, and before the second chemical mechanical polishing, the second silicon oxide film is heat-treated in an oxygen atmosphere.

In a further preferred variation, the first silicon oxide film is formed by a sub-atmospheric chemical vapor deposition process using $\{O_3+TEOS\}$ as a starting material, or alternatively by depositing and baking a hydrogenated inorganic SOG film, and after the first chemical mechanical polishing but prior to the selective removal of the silicon nitride film, the first silicon oxide film is heat-treated in an oxygen atmosphere, and wherein the second silicon oxide film is formed by a sub-atmospheric chemical vapor deposition process using $\{O_3+TEOS\}$ as a starting material, or alternatively by depositing and baking a hydrogenated inorganic SOG film, and before the second chemical mechanical polishing, the second silicon oxide film is heat-treated in an oxygen atmosphere.

The above and other objects, features and advantages of the present invention will be apparent from the following description of preferred embodiments of the invention with reference to the accompanying drawings.

BRIEF DESCRIPTION OF THE DRAWINGS

FIGS. 3A to 3D are diagrammatic sectional views illustrating an essential process of a third variation of the first embodiment of the method in accordance with the present invention for forming the device isolation region of the STI structure in the semiconductor device;

DETAILED DESCRIPTION OF THE INVENTION

Now, embodiments of the method in accordance with the present invention for forming the device isolation region of the STI structure in the semiconductor device will be described with reference to the accompanying drawings.

A first variation of a first embodiment of the method in accordance with the present invention for forming the device isolation region of the STI structure in the semiconductor device will be described with reference to FIGS. 1A to 1E, which are diagrammatic sectional views illustrating the first variation of the first embodiment.

On a principal surface of a silicon substrate 101, a pad oxide film 102 is formed by a thermal oxidation. This pad oxide film 102 has a film thickness of about 8 nm to 16 nm. Then, a silicon nitride film 121 having a film thickness of about 50 nm to 200 nm is deposited on the whole surface by a CVD process. The pad oxide film 102 is provided for the purpose of relaxing a stress in various later steps including a heat treatment step, and also for the purpose of functioning as an etching stopper and of protecting the principal surface of the silicon substrate 101 within the active regions when the silicon nitride film 121 is removed by a wet etching.

Figure 1A:
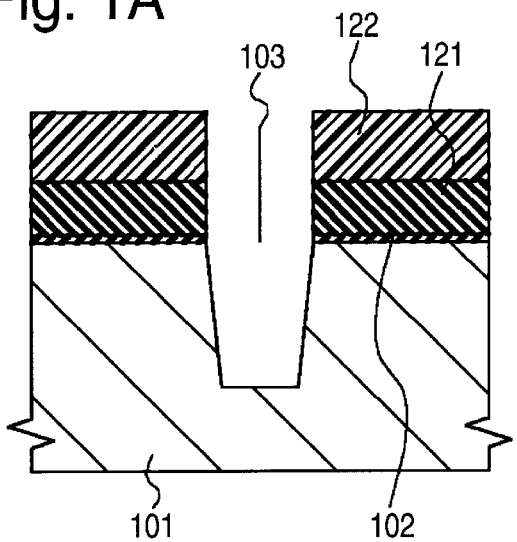
FIGS. 1A to 1E are diagrammatic sectional views illustrating a first variation of a first embodiment of the method in accordance with the present invention for forming the device isolation region of the STI structure in the semiconductor device.

Furthermore, a patterned photoresist film 122 is formed on a surface of the silicon nitride film 121. By using the patterned photoresist film 122 as a mask, the silicon nitride film 121 and the pad oxide film 102 are etched in the named order by an anisotropic etching, and then, by using the patterned photoresist film 122 as the mask, again, the silicon substrate 101 is taper-etched by an anisotropic etching using for example a mixed gas of $Cl_2+O_2$ (+HBr), so that a trench 103 is formed on the principal surface of the silicon substrate 101, as shown in FIG. 1A. A tapered angle, a minimum width and a depth of the trench 103 thus formed are about 80 degrees to 85 degrees, about 0.1 $\mu m$ to 0.25 $\mu m$, and about 150 nm to 500 nm, respectively.

After the patterned photoresist film 122 is removed, a surface protecting oxide film 104A is formed on a surface of the trench 103 by a thermal oxidation. This surface protecting oxide film 104A has a film thickness of at least 30 nm, and preferably has a film thickness of about 40 nm.

In this first variation of the first embodiment, the surface protecting oxide film 104A is provided for the purpose of rounding an upper edge of the trench 103, and for the purpose of protecting the silicon substrate 101 at the surface of the trench 103 from an attack of a HD-PECVD (high-density plasmas-enhanced chemical vapor deposition) process accompanied with a bias sputtering in a later step for forming a first silicon oxide film. For a sufficient protection against the attack of the HD-PECVD, the film thickness of the surface protecting oxide film 104A is required to have at least 30 nm. However, if the surface protecting oxide film 104A is too thick, another problem occurs in which a bird's beak becomes large at the upper edge of the groove 103, with the result that an area of the active region becomes smaller than an expected value, and therefore, a channel width becomes smaller than an expected width, and in addition, the stress increases.

Figure 1B:
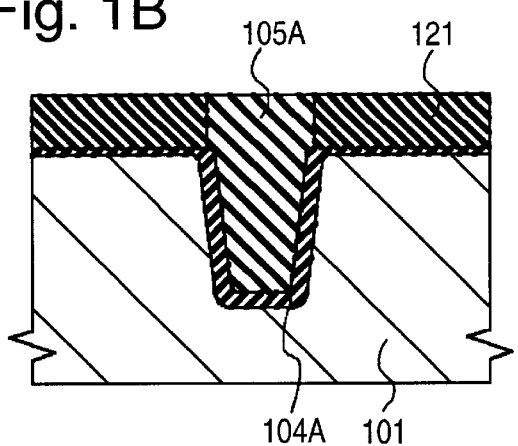

Thereafter, by the HD-PECVD process accompanied with bias sputtering, a first silicon oxide film (not shown) is deposited on the whole surface to fill up the trench 103 and to cover the surface of the silicon nitride film 121. This first silicon oxide film has properties near to that of a silicon oxide film formed by a thermal oxidation. The HD-PECVD process can be exemplified by an ECR (electron cyclotron resonance)-PECVD, an ICP (inductively coupled plasma)-CVD, and a helicon wave PECVD. Succeedingly, a first CMP process is carried out by using the silicon nitride film 121 as a stopper, so that there remains a (first) silicon oxide film 105A filling up the trench 103 formed in the silicon substrate 101 and a gap formed in the silicon nitride film 121 in conjunction with the trench 103, as shown in FIG. 1B.

Figure 1C:
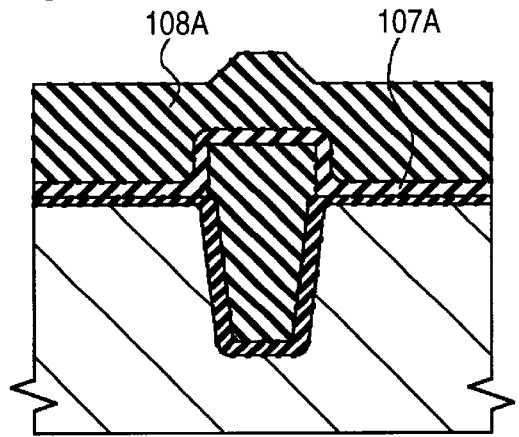

Succeedingly, the silicon nitride film 121 is selectively removed by a wet etching (using for example a hot phosphoric acid) or alternatively a dry etching. Furthermore, a high-temperature oxide film (abbreviated to "HTO film" in this specification) 107A having a desired film thickness is formed on the whole surface by a LPCVD (low pressure CVD) process using a mixed gas of $\{SiH_4+N_2O\}$ or $\{SiH_2Cl_2+N_2O\}$. The film thickness of the HTO film 107A is sufficient if a total film thickness of the HTO film 107A and the pad oxide film 102 becomes at least 30 nm, because this HTO film 107A is provided for the same purpose as that of the provision of the surface protecting oxide film 104A. Thereafter, a second silicon oxide film 108A is formed on the whole surface by the HD-PECVD process, as shown in FIG. 1C.

Figure 1D:
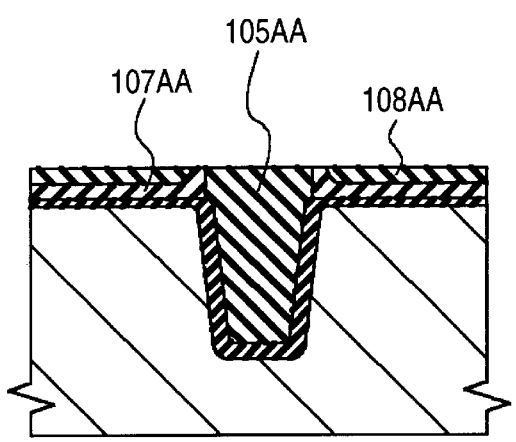

In this condition, a second CMP process is carried out for planarization so that for example, a silicon oxide film 108AA, a HTO film 107AA and a silicon oxide film 105AA remain as shown in FIG. 1D. This CMP process is preferably stopped in a condition in which the principal surface of the silicon substrate 101 is completely covered with the pad oxide film 102 (or a remaining portion of the pad oxide film 102), namely, in a condition in which the principal surface of the silicon substrate 101 is maintained in an non-exposed condition. The reason for this is that a wet etching to be carried out in a next step can be carried out with a desired degree of precision. In the course of the second CMP process, the thickness of the film remaining on the principal surface of the silicon substrate 101 can be measured by an electrostatic capacitance method or an optical measurement.

Figure 1E:
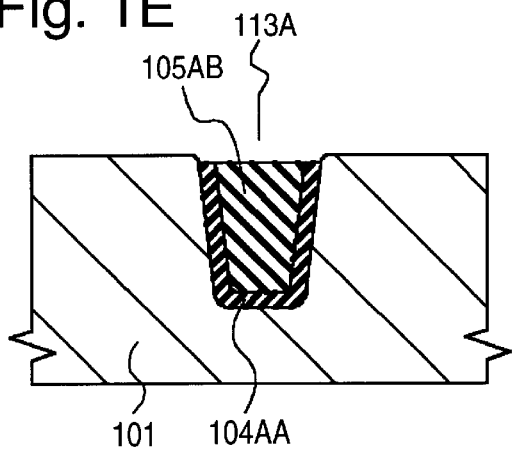

Thereafter, a wet etching is carried out using a buffered hydrofluoric acid or a diluted hydrofluoric acid until the principal surface of the silicon substrate 101 is exposed. Thus, a device isolation region 113A of the STI structure composed of the trench 103 filled up with the surface protecting oxide film 104AA and the silicon oxide film 105AB is formed as shown in FIG. 1E.

In the above mentioned first variation of the first embodiment of the method in accordance with the present invention for forming the device isolation region of the STI structure in the semiconductor device, since the principal surface of the silicon substrate 101 is exposed by the wet etching carried out after the second CMP process, the active region is prevented from being contaminated in the CMP process, and the roughing of the surface is avoided, and furthermore, an additional planarization step is no longer required. Furthermore, since it is easy to control a step difference between the principal surface of the silicon substrate 101 and the upper surface of the surface protecting oxide film 104AA and the silicon oxide film 105AB in the device isolation region 113, to a value not greater than 20 nm, it is also easy to prevent occurrence of the inverse narrow width effect and to avoid residues of the gate electrode forming material along the trench upper edge in the gate electrode forming process.

Now, a second variation of the first embodiment of the method in accordance with the present invention for forming the device isolation region of the STI structure in the semiconductor device will be described with reference to FIGS. 2A to 2D, which are diagrammatic sectional views illustrating an essential process of the second variation of the first embodiment.

Similarly to the first variation of the first embodiment, a pad oxide film 102 is formed on a principal surface of a silicon substrate 101 by a thermal oxidation. This pad oxide film 102 has a film thickness of about 8 nm to 16 nm. Then, a silicon nitride film (not shown) having a film thickness of about 50 nm to 200 nm is deposited on the whole surface by a CVD process. Furthermore, a patterned photoresist film (not shown) is formed on a surface of the silicon nitride film, and then, by using the patterned photoresist film as a mask, the silicon nitride film, the pad oxide film 102 and the silicon substrate 101 are etched in the named order by an anisotropic etching so that a tapered trench 103 is formed on the principal surface of the silicon substrate 101. After the patterned photoresist film is removed, a surface protecting oxide film 104B is formed on a surface of the trench 103 by a thermal oxidation. This surface protecting oxide film 104B has a film thickness of at least 30 nm, and preferably has a film thickness of about 40 nm.

Furthermore, similarly to the first variation of the first embodiment, by a HD-PECVD process accompanied with a bias sputtering, a first silicon oxide film (not shown) is deposited on the whole surface to fill up the trench 103 and to cover the surface of the silicon nitride film. Subsequently, a first CMP process is carried out by using the silicon nitride film as a stopper, so that there remains a silicon oxide film 105B filling up the trench 103 formed in the silicon substrate 101 and a gap formed in the silicon nitride film in conjunction with the trench. Thereafter, the silicon nitride film is selectively removed, and then, an HTO film 107B having a desired film thickness is formed on the whole surface by a LPCVD process. The film thickness of the HTO film 107B is sufficient if a total film thickness of the HTO film 107B and the pad oxide film 102 becomes at least 30 nm.

Figure 2A:
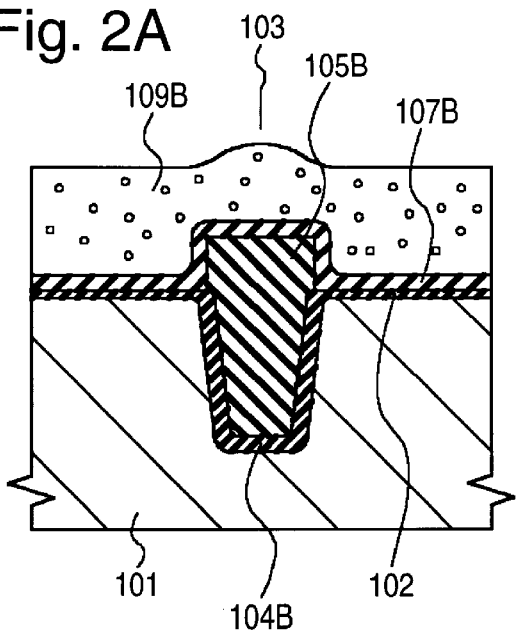
FIGS. 2A to 2D are diagrammatic sectional views illustrating an essential process of a second variation of the first embodiment of the method in accordance with the present invention for forming the device isolation region of the STI structure in the semiconductor device.

Thereafter, by a film deposition process different from the process in the first variation of the first embodiment, a second silicon oxide film 109B is formed on the whole surface as shown in FIG. 2A. This second silicon oxide film 109B is formed by a sub-atmospheric CVD (for example, $2.7 \times 10^4$ Pa and 400 degrees Celsius to 500 degrees Celsius) using {$O_3$ (ozone)+TEOS (tetraethylorthosilicate)} as a starting material, or alternatively by depositing and baking a hydrogenated inorganic SOG (spin on glass) film. The hydrogenated inorganic SOG film is a carbon-free SOG film, and has an extremely small baking volume shrinkage, differently from the other inorganic SOG films. The hydrogenated inorganic SOG film can be formed by using $(HSiO_{3/2})_n$ as a starting material.

Figure 2D:
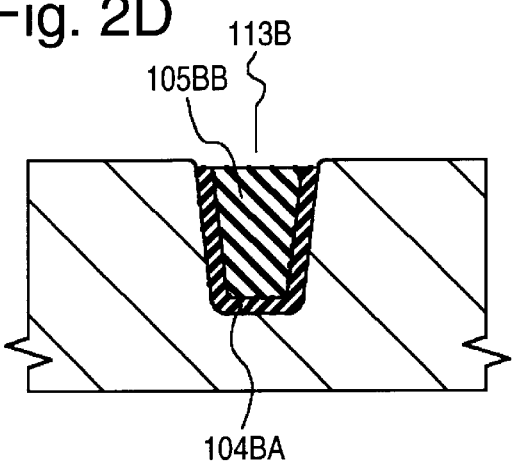
Figure 2B:
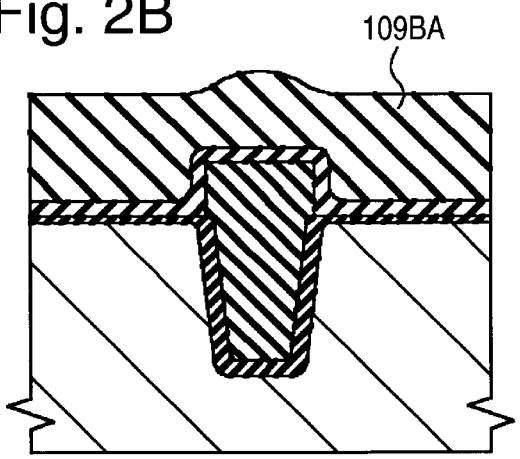

Succeedingly, a heat treatment is carried out in an oxygen atmosphere at a temperature of 800 degrees Celsius to 1000 degrees Celsius, so that the silicon oxide film 109B is converted into a densified silicon oxide film 109BA, as shown in FIG. 2B. This treatment is required for the purpose of reducing a difference in a polishing rate between the underlying silicon oxide film and the second silicon oxide film in a second CMP process carried out in a later step. In addition, the total film thickness of the HTO film 107B and the pad oxide film 102 is set to be at least 30 nm, for the purpose of preventing impurity including moisture from penetrating the second silicon oxide film to the principal surface of the silicon substrate 101 in the active regions in the process of the heat treatment.

Figure 2C:
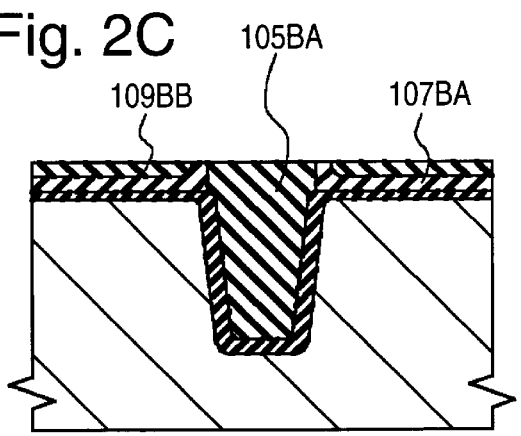

Thereafter, similarly to the first variation of the first embodiment, a second CMP process is carried out so that for example a silicon oxide film 109BB, a HTO film 107BA and a silicon oxide film 105BA remain as shown in FIG. 2C.

Then, similarly to the first variation of the first embodiment, a wet etching is carried out using a buffered hydrofluoric acid or a diluted hydrofluoric acid until the principal surface of the silicon substrate 101 is exposed. Thus, a device isolation region 113B of the STI structure composed of the trench 103 filled up with the surface protecting oxide film 104BA and the silicon oxide film 105BB is formed as shown in FIG. 2D.

Thus, the above mentioned second variation of the first embodiment can provide an advantage similar to that obtained in the first variation of the first embodiment.

Now, a third variation of the first embodiment of the method in accordance with the present invention for forming the device isolation region of the STI structure in the semiconductor device will be described with reference to FIGS. 3A to 3D, which are diagrammatic sectional views illustrating an essential process of the third variation of the first embodiment.

Similarly to the first and second variations of the first embodiment, a pad oxide film 102 is formed on a principal surface of a silicon substrate 101 by a thermal oxidation, and then, a silicon nitride film 121 is deposited on the whole surface by a CVD process. Furthermore, a patterned photoresist film (not shown) is formed on a surface of the silicon nitride film 121, and then, by using the patterned photoresist film as a mask, the silicon nitride film 121, the pad oxide film 102 and the silicon substrate 101 are etched in the named order by an anisotropic etching so that a tapered trench 103 is formed on the principal surface of the silicon substrate 101. After the patterned photoresist film is removed, a surface protecting oxide film 104C is formed on a surface of the trench 103 by a thermal oxidation. This surface protecting oxide film 104B has a film thickness of at least 30 nm, and preferably has a film thickness of about 40 nm.

Thereafter, differently from the first and second variations of the first embodiment, a first silicon oxide film 106 is formed on the whole surface to fill up the trench 103 and to cover the surface of the silicon nitride film 121, as shown in FIG. 3A, by a sub-atmospheric CVD using {O$_3$+TEOS} as a starting material, or alternatively by depositing and baking a hydrogenated inorganic SOG film.

Subsequently, a first CMP process is carried out by using the silicon nitride film 121 as a stopper, so that, as shown in FIG. 3B, there remains a (first) silicon oxide film 106C filling up the trench 103 formed in the silicon substrate 101 and a gap formed in the silicon nitride film 121 in conjunction with the trench. Then, a heat treatment is carried out in an oxygen atmosphere at a temperature of 800 degrees Celsius to 1000 degrees Celsius, so that the silicon oxide film 106C is converted into a densified silicon oxide film 106CA, as shown in FIG. 3C.

Thereafter, the silicon nitride film 121 is selectively removed, and then, an HTO film 107C having a desired film thickness is formed on the whole surface by a LPCVD process. The desired film thickness of the HTO film 107B is sufficient if a total film thickness of the HTO film 107C and the pad oxide film 102 becomes at least 30 nm. Furthermore, similarly to the second variation of the first embodiment, a second silicon oxide film 109C is formed on the whole surface as shown in FIG. 3D. The condition shown in FIG. 3D substantially corresponds to the condition shown FIG. 2A, and thereafter, the process is carried out similarly to the second variation of the first embodiment until the device isolation region of the STI structure is formed.

Thus, the above mentioned third variation of the first embodiment can provide an advantage similar to that obtained in the first and second variations of the first embodiment.

The above mentioned first embodiment is characterized in that after the first CMP process, the first silicon oxide film remains in the trench, and after the silicon nitride film is removed, the HTO film is formed on the whole surface. However, the method in accordance with the present invention is not limited to this procedure, as will be seen from the following:

Now, a first variation of a second embodiment of the method in accordance with the present invention for forming the device isolation region of the STI structure in the semiconductor device will be described with reference to FIGS. 4A to 4D, which are diagrammatic sectional views illustrating the first variation of the second embodiment.

On a principal surface of a silicon substrate 201, a pad oxide film 202 is formed by a thermal oxidation. This pad oxide film 202 has a film thickness of about 8 nm to 16 nm. Then, a silicon nitride film (not shown) having a film thickness of about 50 nm to 200 nm is deposited on the whole surface by a CVD process. Furthermore, a patterned photoresist film (not shown) is formed on a surface of the silicon nitride film. By using the patterned photoresist film as a mask, the silicon nitride film and the pad oxide film 202 are etched in the named order by an anisotropic etching, and then, by using the patterned photoresist film as the mask, again, the silicon substrate 201 is taper-etched by an anisotropic etching using for example a mixed gas of Cl$_2$+O$_2$ (+HBr), so that a trench 203 is formed on the principal surface of the silicon substrate 201. A tapered angle, a minimum width and a depth of the trench 203 are about 80 degrees to 85 degrees, about 0.1 μm to 0.25 μm, and about 150 nm to 500 nm, respectively. After the patterned photoresist film is removed, a surface protecting oxide film 204A is formed on a surface of the trench 203 by a thermal oxidation. This surface protecting oxide film 204A has a film thickness of at least 30 nm, and preferably has a film thickness of about 40 nm.

Figure 4A:
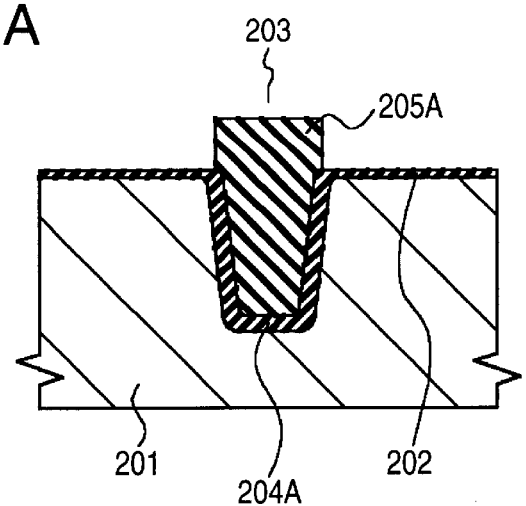
FIGS. 4A to 4D are diagrammatic sectional views illustrating an essential process of a first variation of a second embodiment of the method in accordance with the present invention for forming the device isolation region of the STI structure in the semiconductor device.

Thereafter, by a HD-PECVD process accompanied with a bias sputtering, a first silicon oxide film (not shown) is deposited on the whole surface to fill up the trench 203 and to cover the surface of the silicon nitride film. Succeedingly, a first CMP process is carried out by using the silicon nitride film as a stopper, so that there remains a silicon oxide film 205A filling up the trench 203 formed in the silicon substrate 201 and a gap formed in the silicon nitride film in conjunction with the trench 203. Then, the silicon nitride film is selectively removed by a wet etching (using for example a hot phosphoric acid) or alternatively a dry etching, as shown in FIG. 4A.

Figure 4B:
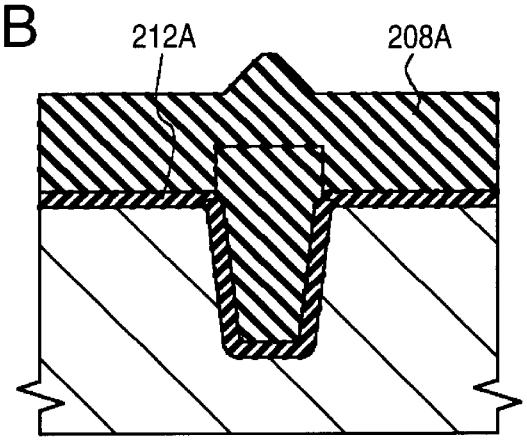

Thereafter, differently from the first embodiment, a thermal oxidation is carried out so that the pad oxide film 202 is converted into a thermal oxide film 212A having an increased film thickness of at least 30 nm. Furthermore, similarly to the first variation of the first embodiment, a second silicon oxide film 208A is formed on the whole surface by a HD-PECVD process, as shown in FIG. 4B.

Figure 4C:
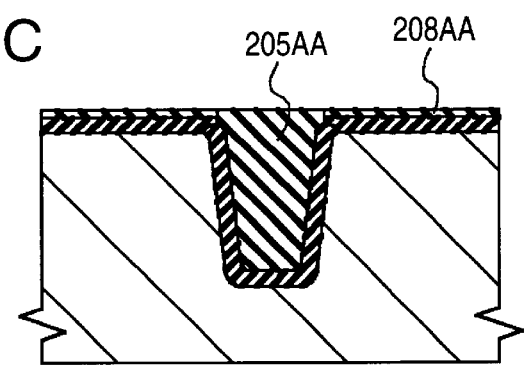
Figure 4D:
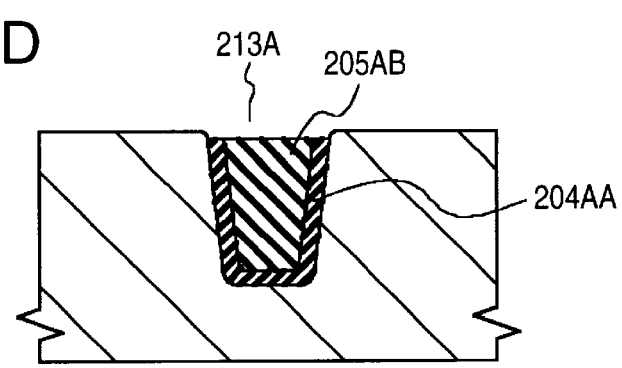

Then, similarly to the first variation of the first embodiment, a second CMP process is carried out so that for example, a silicon oxide film 208AA and a silicon oxide film 205AA remain as shown in FIG. 4C. Similarly to the first variation of the first embodiment, this CMP process is preferably stopped in a condition in which the principal surface of the silicon substrate 201 is covered with the thermal oxide film 212A (or a remaining portion of the thermal oxide film 212A), namely, in a condition in which the principal surface of the silicon substrate 201 is maintained in an non-exposed condition. In the course of the second CMP process, the thickness of the film remaining on the principal surface of the silicon substrate 201 can be measured by an electrostatic capacitance method or an optical measurement.

Thereafter, similarly to the first variation of the first embodiment, a wet etching is carried out using a buffered hydrofluoric acid or a diluted hydrofluoric acid until the principal surface of the silicon substrate 201 is exposed. Thus, a device isolation region 213A of the STI structure composed of the trench filled up with the surface protecting oxide film 204AA and the silicon oxide film 205AB is formed as shown in FIG. 4E.

Thus, the above mentioned first variation of the second embodiment can provide an advantage similar to that obtained in the first variation of the first embodiment.

Now, a second variation of the second embodiment of the method in accordance with the present invention for forming the device isolation region of the STI structure in the semiconductor device will be described with reference to FIGS. 5A to 5D, which are diagrammatic sectional views illustrating an essential process of the second variation of the second embodiment.

Similarly to the first variation of the second embodiment, a pad oxide film 202 is formed on a principal surface of a silicon substrate 201 by a thermal oxidation. This pad oxide film 202 has a film thickness of about 8 nm to 16 nm. Then, a silicon nitride film (not shown) having a film thickness of about 50 nm to 200 nm is deposited on the whole surface by a CVD process. Furthermore, a patterned photoresist film (not shown) is formed on a surface of the silicon nitride film. By using the patterned photoresist film as a mask, the silicon nitride film, the pad oxide film 202 and the silicon substrate 201 are etched in the named order by an anisotropic etching, so that a tapered trench 203 is formed on the principal surface of the silicon substrate 201. After the patterned photoresist film is removed, a surface protecting oxide film 204B is formed on a surface of the trench 203 by a thermal oxidation. This surface protecting oxide film 204B has a film thickness of at least 30 nm, and preferably has a film thickness of about 40 nm.

Thereafter, similarly. to the first variation of the second embodiment, by a HD-PECVD process accompanied with a bias sputtering, a first silicon oxide film (not shown) is deposited on the whole surface to fill up the trench 203 and to cover the surface of the silicon nitride film. Succeedingly, a first CMP process is carried out by using the silicon nitride film as a stopper, so that there remains a silicon oxide film 205B filling up the trench 203 formed in the silicon substrate 201 and a gap formed in the silicon nitride film in conjunction with the trench 203. Then, the silicon nitride film is selectively removed.

Figure 5A:
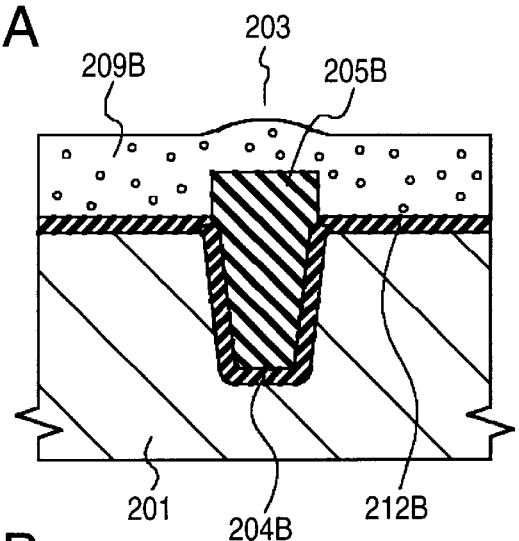
FIGS. 5A to 5D are diagrammatic sectional views illustrating an essential process of a second variation of the second embodiment of the method in accordance with the present invention for forming the device isolation region of the STI structure in the semiconductor device.

Thereafter, similarly to the first variation of the second embodiment, a thermal oxidation is carried out so that the pad oxide film 202 is converted into a thermal oxide film 212B having an increased film thickness of at least 30 nm. Then, similarly to the second variation of the first embodiment, a second silicon oxide film 209B is formed on the whole surface as shown in FIG. 5A, by a sub-atmospheric CVD using $\{O_3+TEOS\}$ as a starting material, or alternatively by depositing and baking a hydrogenated inorganic SOG film. The hydrogenated inorganic SOG film is a carbon-free SOG film, and has an extremely small baking volume shrinkage, differently from the other inorganic SOG films. The hydrogenated inorganic SOG film can be formed by using $(HSiO_{3/2})_n$ as a starting material.

Figure 5B:
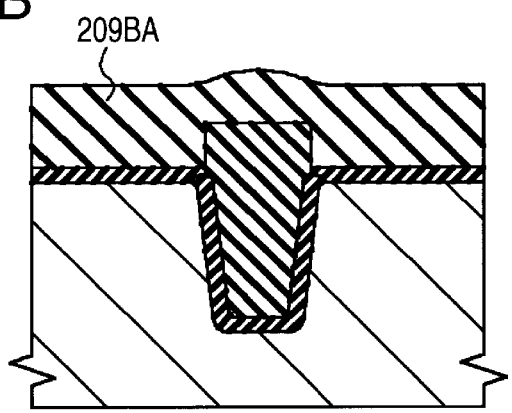

Succeedingly, a heat treatment is carried out in an oxygen atmosphere at a temperature of 800 degrees Celsius to 1000 degrees Celsius, so that the silicon oxide film 209B is converted into a densified silicon oxide film 209BA, as shown in FIG. 5B. This treatment is required for the purpose of reducing a difference in a polishing rate between the underlying silicon oxide film and the second silicon oxide film in a second CMP process carried out in a later step. In addition, the film thickness of the thermal oxide film 212B is set to be at least 30 nm, for the purpose of preventing impurity including moisture from penetrating the second silicon oxide film to the principal surface of the silicon substrate 201 in the active regions in the process of the heat treatment.

Figure 5C:
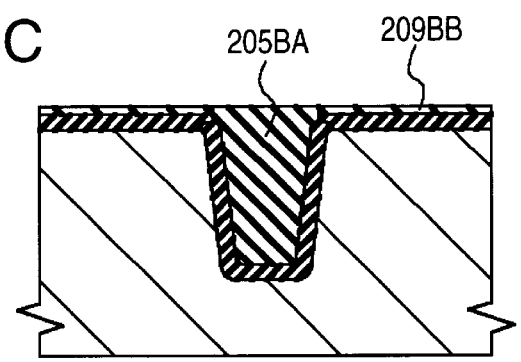

Thereafter, similarly to the first variation of the second embodiment, a second CMP process is carried out so that for example a silicon oxide film 209BB and a silicon oxide film 205BA remain as shown in FIG. 5C.

Figure 5D:
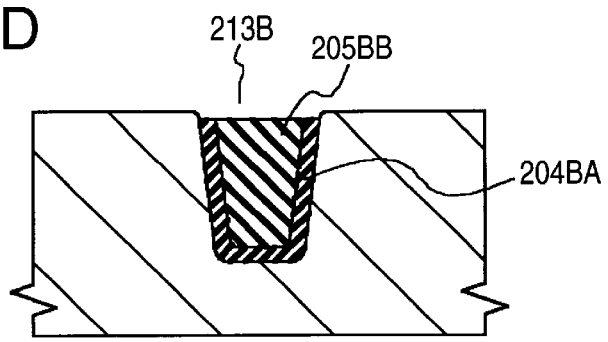

Then, similarly to the first variation of the second embodiment, a wet etching is carried out using a buffered hydrofluoric acid or a diluted hydrofluoric acid until the principal surface of the silicon substrate 201 is exposed. Thus, a device isolation region 213B of the STI structure composed of the trench filled up with the surface protecting oxide film 204BA and the silicon oxide film 205BB is formed as shown in FIG. 5D.

Thus, the above mentioned second variation of the second embodiment can provide an advantage similar to that obtained in the first variation of the second embodiment.

Figure 6A:
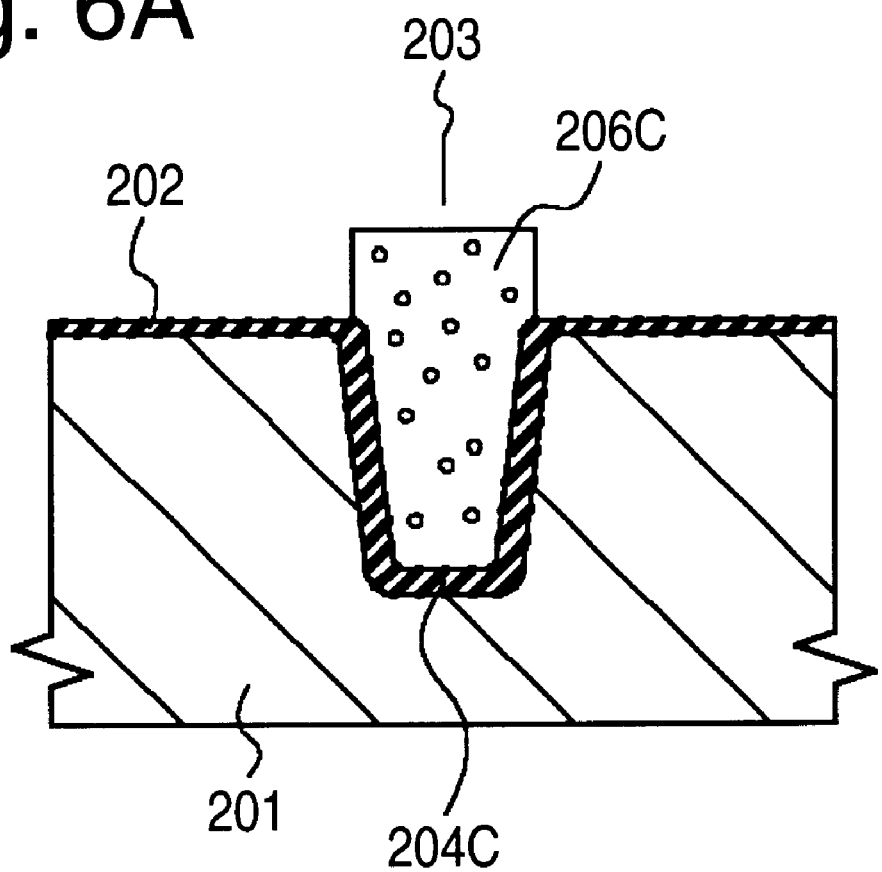
FIGS. 6A and 6B are diagrammatic sectional views illustrating an essential process of a third variation of the second embodiment of the method in accordance with the present invention for forming the device isolation region of the STI structure in the semiconductor device.
Figure 6B:
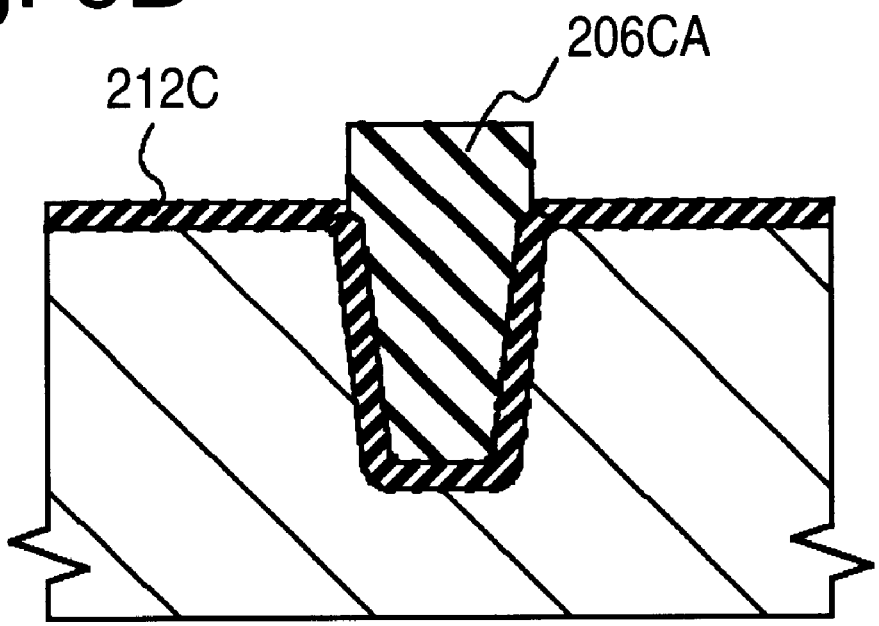
Figure 7A:
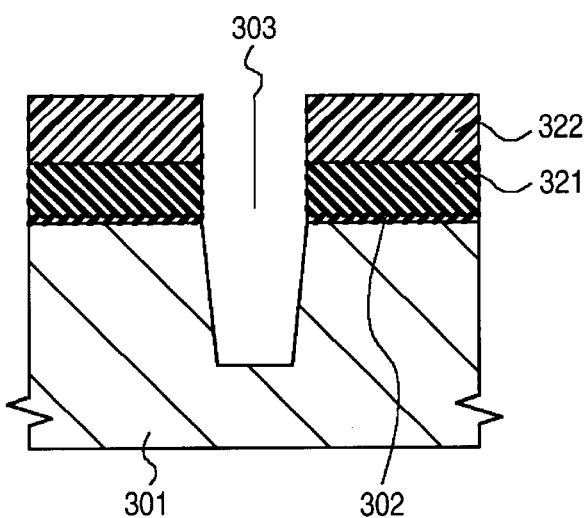
FIGS. 7A to 7D are diagrammatic sectional views illustrating the typical prior art method for forming the device isolation region of the STI structure in the semiconductor device.
Figure 7B:
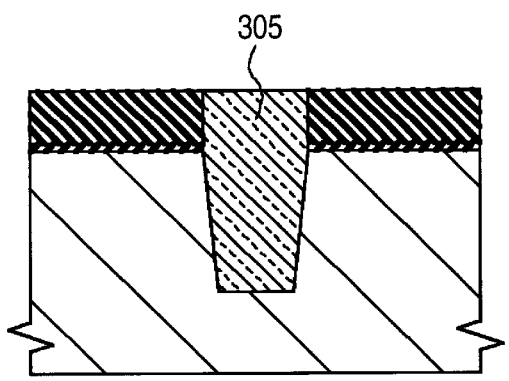
Figure 7C:
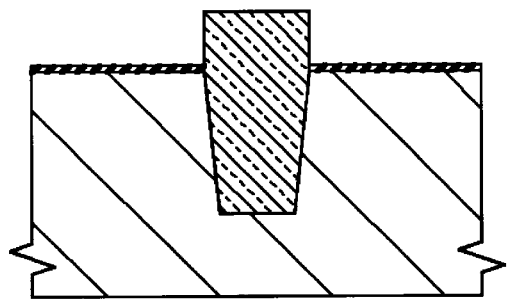
Figure 7D:
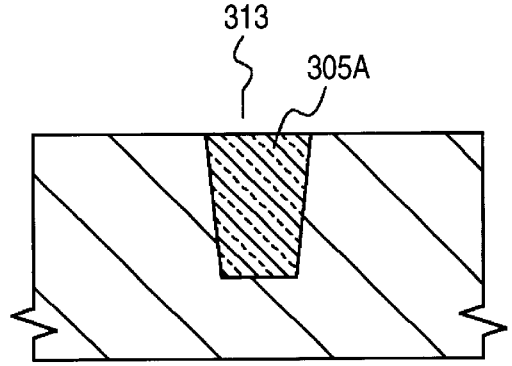

Now, a third variation of the second embodiment of the method in accordance with the present invention for forming the device isolation region of the STI structure in the semiconductor device will be described with reference to FIGS. 6A and 6B, which are diagrammatic sectional views illustrating an essential process of the third variation of the second embodiment.

Similarly to the first and second variations of the second embodiment, a pad oxide film 202 is formed on a principal surface of a silicon substrate 201 by a thermal oxidation, and then, a silicon nitride film (not shown) is deposited on the whole surface by a CVD process. Furthermore, a patterned photoresist film (not shown) is formed on a surface of the silicon nitride film, and then, by using the patterned photoresist film as a mask, the silicon nitride film, the pad oxide film 202 and the silicon substrate 201 are etched in the named order by an anisotropic etching so that a tapered trench 203 is formed on the principal surface of the silicon substrate 201. After the patterned photoresist film is removed, a surface protecting oxide film 204C is formed on a surface of the trench 203 by a thermal oxidation. This surface protecting oxide film 204C has a film thickness of at least 30 nm, and preferably has a film thickness of about 40 nm.

Thereafter, similarly to the third variation of the first embodiment, a first silicon oxide film (not shown) is formed on the whole surface to fill up the trench 203 and to cover the surface of the silicon nitride film, by a sub-atmospheric CVD using $\{O_3+TEOS\}$ as a starting material, or alternatively by depositing and baking a hydrogenated inorganic SOG film.

Succeedingly, a first CMP process is carried out by using the silicon nitride film as a stopper, so that there remains a (first) silicon oxide film 206C filling up the trench 203 formed in the silicon substrate 201 and a gap formed in the silicon nitride film in conjunction with the trench. Then, similarly to the third variation of the first embodiment, the silicon nitride film is selectively removed, as shown in FIG. 6A.

Succeedingly, similarly to the first and second versions of the second embodiment, a thermal oxidation is carried out so that the pad oxide film 202 is converted into a thermal oxide film 212C having an increased film thickness of at least 30 nm. At the same time, the silicon oxide film 206c is converted into a densified silicon oxide film 206CA, as shown in FIG. 6B. The condition shown in FIG. 6B substantially corresponds to the condition shown FIG. 5A excluding the second silicon oxide film 209B, and thereafter, the process is carried out similarly to the second variation of the second embodiment until the device isolation region of the STI structure is formed.

Thus, the above mentioned third variation of the second embodiment can provide an advantage similar to that obtained in the first and second variations of the second embodiment.

As seen from the above, in the method in accordance with the present invention, after the pad oxide film and the silicon nitride film are formed on the principal surface of the silicon substrate, the trench is formed, and then, the surface protecting oxide film is formed on the principal surface of the trench by the thermal oxidation. Furthermore, the first silicon oxide film is deposited on the whole surface to fill up the trench, and then, by using the silicon nitride film as a stopper, the first CMP process is carried out to remove portions of the first silicon oxide film. Thereafter, the silicon nitride film is removed, and the HTO film is formed, or alternatively, the thermal oxidation is carried out again, so as to increase the film thickness of the oxide film on the principal surface of the silicon substrate. Then, the second silicon oxide film is formed, and furthermore, a second CMP process is carried out for planarization to the extent that the principal surface of the silicon substrate is not exposed. Finally, the wet etching (for example using the hydrofluoric acid based etching liquid) is carried so that the device isolation region of the STI structure is formed.

Accordingly, the device isolation region of the STI structure minimizing the deterioration of the electric characteristics (such as the increase of the inverse narrow width effect) can be formed with no necessity of adding a new planarization step for the principal surface of the silicon substrate in the active regions. It then becomes easy to avoid the previously noted problem of etching residues of the gate electrode forming material along the trench upper edge in the gate electrode forming process.

The invention has thus been shown and described with reference to the specific embodiments. However, it should be noted that the present invention is in no way limited to the details of the illustrated structures but changes and modifications may be made within the scope of the appended claims.

I claim:

1. A method for forming a device isolation region of a shallow trench isolation structure in a semiconductor device, the method including the steps of:

forming a pad oxide film and a silicon nitride film on a principal surface of a silicon substrate in the named order, and forming a trench which penetrates through said pad oxide film and said silicon nitride film and extends from said principal surface of said silicon substrate into a body of said silicon substrate;

carrying out a thermal oxidation to form a surface protecting oxide film on a surface of said trench;

depositing a first silicon oxide film on the whole surface to fill up said trench and to cover said silicon nitride film, and carrying out a first chemical mechanical polishing for said first silicon oxide film until said silicon nitride film is exposed;

selectively removing said silicon nitride film, and forming upon said principal surface of said silicon oxide protection film including said pad oxide film and having an increased film thickness sufficient to protect said principal surface of said silicon substrate in a later step;

depositing a second silicon oxide film on the whole surface;

carrying out a second chemical mechanical polishing for planarization, to remove at least a major portion of said second silicon oxide film from said principal surface of said silicon substrate but to maintain said principal surface of said silicon substrate in an non-exposed condition; and carrying out a wet etching until said principal surface of said silicon substrate is substantially exposed.

2. A method claimed in claim 1 wherein said silicon oxide protection film is formed by depositing a high-temperature oxide film on the whole surface including a surface of said pad oxide film.

3. A method claimed in claim 1 wherein said silicon oxide protection film is formed by carrying out a thermal oxidation to convert said pad oxide film into a thermal oxide film having an increased film thickness.

4. A method for forming a device isolation region of a shallow trench isolation structure in a semiconductor device, the method including the steps of:

forming a pad oxide film on a principal surface of a silicon substrate by a first thermal oxidation, depositing a silicon nitride film on the whole surface, and carrying out an anisotropic etching using a patterned photoresist film formed on said silicon nitride film as a mask, to selectively remove said silicon nitride film and said pad oxide film and to form a trench in said principal surface of said silicon substrate;

carrying out a second thermal oxidation to form a surface protecting oxide film on a surface of said trench;

depositing a first silicon oxide film on the whole surface to fill up said trench and to cover said silicon nitride film, and carrying out a first chemical mechanical polishing for said first silicon oxide film until said silicon nitride film is exposed;

selectively removing said silicon nitride film, depositing a high-temperature oxide film on the whole surface, and then, depositing a second silicon oxide film on the whole surface;

carrying out a second chemical mechanical polishing for planarization, to remove at least a major portion of said second silicon oxide film from said principal surface of said silicon substrate but to maintain said principal surface of said silicon substrate in an non-exposed condition; and carrying out a wet etching until said principal surface of said silicon substrate is substantially exposed.

5. A method claimed in claim 4 wherein said high-temperature oxide film is formed by a low pressure chemical vapor deposition process.

6. A method claimed in claim 4 wherein said first silicon oxide film is formed by a high-density plasma-enhanced chemical vapor deposition process.

7. A method claimed in claim 4 wherein each of said first silicon oxide film and said second silicon oxide film is formed by a high-density plasma-enhanced chemical vapor deposition process.

8. A method claimed in claim 4 wherein said first silicon oxide film is formed by a high-density plasma-enhanced chemical vapor deposition process, and wherein said second silicon oxide film is formed by a sub-atmospheric chemical vapor deposition process using $\{O_3+TEOS\}$ as a starting material, or alternatively by depositing and baking a hydrogenated inorganic SOG film, and before said second chemical mechanical polishing, said second silicon oxide film is heat-treated in an oxygen atmosphere.

9. A method claimed in claim 4 wherein said first silicon oxide film is formed by a sub-atmospheric chemical vapor deposition process using $\{O_3+TEOS\}$ as a starting material, or alternatively by depositing and baking a hydrogenated inorganic SOG film, and after said first chemical mechanical polishing but the selective removal of said silicon nitride film, said first silicon oxide film is heat-treated in an oxygen atmosphere, and wherein said second silicon oxide film is formed by a sub-atmospheric chemical vapor deposition process using $\{O_3+TEOS\}$ as a starting material, or alternatively by depositing and baking a hydrogenated inorganic SOG film, and before said second chemical mechanical polishing, said second silicon oxide film is heat-treated in an oxygen atmosphere.

10. A method for forming a device isolation region of a shallow trench isolation structure in a semiconductor device, the method including the steps of:

forming a pad oxide film on a principal surface of a silicon substrate by a first thermal oxidation, depositing a silicon nitride film on the whole surface, and carrying out an anisotropic etching using a patterned photoresist film formed on said silicon nitride film as a mask, to selectively remove said silicon nitride film and said pad oxide film and to form a trench in said principal surface of said silicon substrate;

carrying out a second thermal oxidation to form a surface protecting oxide film on a surface of said trench;

depositing a first silicon oxide film on the whole surface to fill up said trench and to cover said silicon nitride film, and carrying out a first chemical mechanical polishing for said first silicon oxide film until said silicon nitride film is exposed;

selectively removing said silicon nitride film, and carrying out a thermal oxidation to convert said pad oxide film into a thermal oxide film having an increased film thickness;

depositing a second silicon oxide film on the whole surface;

carrying out a second chemical mechanical polishing for planarization, to remove at least a major portion of said second silicon oxide film from said principal surface of said silicon substrate but to maintain said principal surface of said silicon substrate in an non-exposed condition; and carrying out a wet etching until said principal surface of said silicon substrate is substantially exposed.

11. A method claimed in claim 10 wherein said first silicon oxide film is formed by a high-density plasma-enhanced chemical vapor deposition process.

12. A method claimed in claim 10 wherein each of said first silicon oxide film and said second silicon oxide film is formed by a high-density plasma-enhanced chemical vapor deposition process.

13. A method claimed in claim 10 wherein said first silicon oxide film is formed by a high-density plasma-enhanced chemical vapor deposition process, and wherein said second silicon oxide film is formed by a sub-atmospheric chemical vapor deposition process using $\{O_3+TEOS\}$ as a starting material, or alternatively by depositing and baking a hydrogenated inorganic SOG film, and before said second chemical mechanical polishing, said second silicon oxide film is heat-treated in an oxygen atmosphere.

14. A method claimed in claim 10 wherein said first silicon oxide film is formed by a sub-atmospheric chemical vapor deposition process using $\{O_3+TEOS\}$ as a starting material, or alternatively by depositing and baking a hydrogenated inorganic SOG film, and after said first chemical mechanical polishing but the selective removal of said silicon nitride film, said first silicon oxide film is heat-treated in an oxygen atmosphere, and wherein said second silicon oxide film is formed by a sub-atmospheric chemical vapor deposition process using $\{O_3+TEOS\}$ as a starting material, or alternatively by depositing and baking a hydrogenated inorganic SOG film, and before said second chemical mechanical polishing, said second silicon oxide film is heat-treated in an oxygen atmosphere.

* * * * *